(12) United States Patent
Badaroglu et al.

(10) Patent No.: US 8,773,157 B2
(45) Date of Patent: Jul. 8, 2014

(54) TEST CIRCUIT FOR TESTING THROUGH-SILICON-VIAS IN 3D INTEGRATED CIRCUITS

(75) Inventors: Mustafa Badaroglu, Leuven (BE); Erik Jan Marinissen, Leuven (BE); Paul Marchal, Blanden (BE)

(73) Assignee: IMEC, Leuven (BE)

( * ) Notice: Subject to any disclaimer, the term of this patent is extended or adjusted under 35 U.S.C. 154(b) by 259 days.

(21) Appl. No.: 13/174,617

(22) Filed: Jun. 30, 2011

(65) Prior Publication Data
US 2013/0002272 A1 Jan. 3, 2013

(51) Int. Cl.
G01R 31/26 (2014.01)
G01R 31/00 (2006.01)

(52) U.S. Cl.
USPC ................................ 324/762.01; 324/750.01

(58) Field of Classification Search
None
See application file for complete search history.

(56) References Cited

U.S. PATENT DOCUMENTS

| | | | |
|---|---|---|---|
| 7,863,106 B2 | 1/2011 | Christo et al. | |
| 7,904,273 B2 * | 3/2011 | Liu et al. | 702/155 |
| 8,219,340 B2 * | 7/2012 | Su et al. | 702/71 |
| 8,400,807 B2 * | 3/2013 | Yoko | 365/51 |
| 2003/0025516 A1 | 2/2003 | Chao et al. | |
| 2004/0186675 A1 | 9/2004 | Larson et al. | |
| 2006/0195749 A1 | 8/2006 | Cohen et al. | |
| 2008/0243740 A1 | 10/2008 | Hauptman | |
| 2009/0212760 A1 | 8/2009 | Von Staudt et al. | |
| 2009/0224784 A1 | 9/2009 | Pagani | |
| 2010/0013512 A1 | 1/2010 | Hargan et al. | |
| 2010/0153043 A1 | 6/2010 | Su et al. | |
| 2010/0185410 A1 | 7/2010 | Bartley et al. | |
| 2010/0332177 A1 | 12/2010 | Wu et al. | |
| 2011/0012633 A1 | 1/2011 | Rahman et al. | |
| 2012/0212272 A1 * | 8/2012 | Yokou et al. | 327/225 |

FOREIGN PATENT DOCUMENTS

| | | |
|---|---|---|
| EP | 1 431 771 A2 | 6/2004 |
| EP | 2 372 379 A1 | 10/2011 |

OTHER PUBLICATIONS

European Search Report for European Patent Application No. EP 11172202 issued Nov. 24, 2011.

* cited by examiner

*Primary Examiner* — Vinh Nguyen
(74) *Attorney, Agent, or Firm* — Knobbe Martens Olson & Bear LLP (57) ABSTRACT

A test circuit and method for testing through-silicon-vias (TSVs) in three-dimensional integrated circuits (ICs) during each phase of manufacturing is disclosed. In one aspect, the method includes testing for faults in each individual TSV, TSV-under-test, shorts between a TSV-under-test, and TSVs in close proximity and for connections between the TSV-under-test and another tier in the ICs. A test circuit has three switchable current paths connected to a power supply via a pull-up resistor and switches: a calibration path, a short path, and a current measurement path. A power supply is connected to the measurement path, and the calibration path and the short path are connected to ground via respective pull-down resistors. For each TSV-under-test, the desired operation mode is selected by the closure of different combinations of switches. The current flowing through the pull-up resistor in each operation mode indicates whether the TSV-under-test has passed or failed the test.

19 Claims, 10 Drawing Sheets

TEST CIRCUIT FOR TESTING THROUGH-SILICON-VIAS IN 3D INTEGRATED CIRCUITS

BACKGROUND OF THE INVENTION

1. Field of the Invention

The disclosed technology relates to fault mode circuits and more particularly, although not exclusively, to full screening of through-silicon-via connections on three-dimensional integrated circuits.

2. Description of the Related Technology

The importance of testing integrated circuits (ICs) is well known and several methods have been used for carrying out such testing. US-A-2009/0224784 describes a method in which a frequency-division multiplexing scheme of test signals is used for reducing the number of input/output contact pads that need to be connected to the semiconductor wafer on which the IC is formed.

U.S. Pat. No. 7,863,106 describes a test fixture for testing wafers in which a test probe assembly provides connectivity to filled-through vias (FTVs) and a conductive glass handler is biased with an appropriate voltage for test. The test probe assembly measures the voltage drop from a top surface bond pad to a FTV to provide an indication of the integrity of the FTV. The test fixture also determines leakage resistance using an opens shorts test.

Built-in-self test (BIST) logic may be included in a three-dimensional (3D) stacked processor chip as described in US-A-2010/0185410. The BIST can test the entire assembled stacked processor chip and/or specific layers in the stack and/or components located on a specific layer. An integrated distributed test interface is built into each later so that all the layers can be tested at the same time.

It is known to check the integrity of through-silicon-via (TSV) connections in three-dimensional (3D) integrated circuits (ICs) and long tracks in mixed-signal ICs. One such apparatus and method is described in US-A-2010/0332177. A test access control apparatus and method for stacked chip devices that can perform system on chip (SOC) test and through-silicon-via (TSV) verification are disclosed. The apparatus includes test access mechanism (TAM) buses and an extended IEEE 1149.1 test access port (TAP) controller connected to the TAM buses. The TAM buses support controls of a memory built-in-self-test (BIST) circuit for memory known-good-die (KGD) tests that are carried out before the chip devices are stacked, and TSV chains for conducting TSV tests that verify any defect appearing in vertical interconnection in the stacked chip devices.

US-A-2010/0153043 also discloses monitoring apparatus for TSVs in a 3D IC. The TSVs are connected in a circuit with a plurality of inverters. A control signal is applied to the circuit to cause it to oscillate. An output signal with an oscillatory wave is generated and the frequency thereof is compared to an output signal obtained from an ideal-manufactured 3D IC having the same configuration to determine if the 3D IC being tested meets pre-defined parameters.

In US-A-2010/0013512, a method of testing TSVs is described. TSV stacks are selected to which a reference voltage source, a current source and a voltage measuring device is connected. Measurement of a voltage drop provides a relative estimation of the resistance of the TSV stack. Comparisons of the estimated resistance for each TSV stack enables the best TSV stacks to be selected for use.

Existing tests for testing TSV connections and long tracks have implementation issues. For example, there may be difficulties with probing dense TSVs individually during wafer-sort and final test processes. It is important to sort good dies from bad dies before moving onto the stacking and/or assembly stages which are relatively expensive processes. The problems associated with sorting of dies include: the inability to probe the integrity of floating TSVs on both thinned and un-thinned wafers due to missing connections; the limitation imposed the electrical tests that need to be carried out at by the requirement to handle very fragile thinned wafers during wafer-sort tests; and the limitation to static logic tests for continuity checks of the connections between tiers as it is not possible the test the quality of the contact.

In addition, it is important to detect misalignment of dies and/or wafers during the stacking process. As this forms the last process before the assembly of the stacked tiers in the final package, detecting a fault at this stage saves the expensive packaging costs. Moreover, it is necessary to detect faults that arise from long wiring between digital and analogue elements of the wafer. Most of the long tracks are prone to bridging errors which can be hard to detect via bridging tests, especially for the interfaces between analogue and digital modes. In such tests, the same track needs to be repeated for the return track to ensure that the signal has been received at its destination correctly. This adds a lot of cost as well as signal integrity issues in these mixed-mode systems.

Existing test structures have severe limitations, for example, the requirement for large silicon area to implement test circuits when used over a large number of TSVs; the need for special analogue process options; limitation to test TSVs that carry digital signals but also analogue signals; the inability to generate a meaningful test output signal that represents the integrity of TSVs; the limitation to characterization exercises on dedicated test circuits (the difficulty of integration into standard equipment or products); the imposition of large loading that limits the performance of the tier-to-tier communication; the lack of calibration of the measurements for each TSV for setting reliable limits for production tests, and the requirement for long test times over a large number of TSVs.

SUMMARY OF CERTAIN INVENTIVE ASPECTS

Certain inventive aspects relate to a fault mode test method that does not suffer from at least one of the problems mentioned above.

Certain inventive aspects also relate to a test circuit for carrying out the fault mode test method.

In accordance with a first inventive aspect, there is provided a method for performing at least one fault mode test on at least one of a plurality of elements arranged on a substrate in an integrated circuit. The method may include a) selecting an element to be tested from the plurality of elements, b) selecting a calibration mode for the selected element, c) determining a calibration current measurement for the selected element, d) selecting a measurement mode for the selected element, e) determining a measurement current for the selected element, f) determining an actual measurement current using the determined calibration current measurement and the determined measurement current, and g) comparing the actual measurement current to a threshold in accordance with a screening condition for the selected element.

In one aspect, the method of fault mode testing of TSVs has improved performance over known methods. It is independent of the architecture of the substrate being tested and all that is required is the ability to connect to each element on the substrate that is to be tested.

Using the method in accordance with one aspect, it is possible to test digital mode, analogue mode and mixed mode elements on the substrate. As a calibration mode is used as part of the testing method, the circuit size required for the test circuit can be reduced, for example, in terms of the silicon resources.

In certain embodiments, process b) comprises activating at least one switch in a path connecting the selected element to a calibration path.

In certain embodiments, process d) comprises activating at least one switch in a path connecting the selected element to a measurement path.

In one embodiment, the at least one fault mode test comprises a leakage test between the selected element and the substrate.

In another embodiment, the at least one fault mode test comprises a short test between the selected element and at least one other element in close proximity to the selected element. Processes b) and c) may be repeated for the at least one other element, and process f) comprises using the calibration measurements for the selected element and the at least one other element.

In a further embodiment, the at least one fault mode test comprises a connection test between the selected element and another tier of the integrated circuit.

In accordance with another aspect, there is provided a test circuit for performing at least one fault mode test on at least one element in an integrated circuit. The circuit may include a power supply, a calibration path connectable to ground and to the at least one element, a short path connectable to ground and to the at least one element, a measurement path connected to the power supply and to the at least one element, a plurality of switches for connecting the at least one element to at least one of the calibration linepath, the short path and the measurement path, and a controller for selecting the at least one element to be tested and for enabling at least one switch in accordance with the at least one fault mode test.

The test circuit according to one inventive aspect can operate only on direct current, so alternating current components that may create interference with the testing process can be avoided.

Preferably, the test circuit further comprises a pull-up resistor connected to the measurement path for providing current measurements in accordance with the at least one fault mode test. The pull-up resistor may either be on-chip or off-chip, that is, forming part of the integrated circuit or forming part of the test circuit.

Additionally, the test circuit preferably further comprises first and second pull-down resistors connected between respective ones of the calibration path and the short path and ground.

The test circuit is particularly useful where the at least one element comprises a through-silicon-via formed on at least one tier of the integrated circuit. In one embodiment, the at least one tier comprises a plurality of through-silicon-vias. In another embodiment, the integrated circuit comprises a plurality of tiers.

Advantageously, one inventive aspect can avoid the use of wafer probes on TSVs to check their integrity as the TSVs are not probed directly. Additionally, the method can be used to screen all phases of the stacking and/or assembly process in 3D thereby reducing the costs by ordering the tests in each phase of the assembly process.

With the method according to one inventive aspect, it is possible to set reliable (stable) production test limits for all TSVs due to the result of calibration for each TSV. Moreover, there can be less area overhead as well as no performance degradation after the integration of monitor circuits. There is no need for special process options, for example, capacitance, resistance etc., where the testing circuit is based on field effect transistors (FETs) in a low cost process.

Run-time monitoring of TSVs allows access to reliability and/or aging faults during the application and allows for correction before the fault occurs. Additionally, an improvement in yield can be obtained by re-routing of signals once a fault is detected in a TSV.

It is possible to integrate the method anywhere in the die and does not need to be close to the actual TSV under test. This is particularly the case in DC-level current-mode operation, where there is no dependence on the RC values of wiring from TSVs to the monitoring circuit.

BRIEF DESCRIPTION OF THE DRAWINGS

For a better understanding of the present disclosure, reference will now be made, by way of example only, to the accompanying drawings in which:—

DETAILED DESCRIPTION OF CERTAIN ILLUSTRATIVE EMBODIMENTS

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes.

Boundary-scan technologies are widely used for testing the integrity of ICs. All the pins (TSVs and/or functional input/output (I/O) pads) that connect to electronic logic are linked together in a set known as the boundary scan chain. JTAG (joint test action group (JTAG) is the common name for the IEEE standard IEEE 1149.1, standard test access port and boundary-scan architecture) is used to manipulate the external interface of the scan chain to test for certain faults, the external interface being input and output connections to other chips. In addition, JTAG can also be used to manipulate internal interfaces to test combinational logic, the internal interface being connections to on-chip registers etc. In both cases, testing is done with the IC after it has been mounted on the circuit board and sometimes whilst the board forms part of an operational system. When combined with BIST, the JTAG scan chain provides a solution for testing certain static faults. Control of scan chain is not limited to JTAG but it could also be done by another serial communication scheme.

Fault mode testing may be implemented at any part of the assembly where fault screening would be performed, for example, in power ground configurations, wafer sort, thinning, redistribution layer (RDL) and stacking, as well as assembly. The test system is compact so that only uses minimum size switches are used in accordance with complementary metal-oxide-semiconductor (CMOS) technology.

Figures 1, 2, 3, 4, 5:
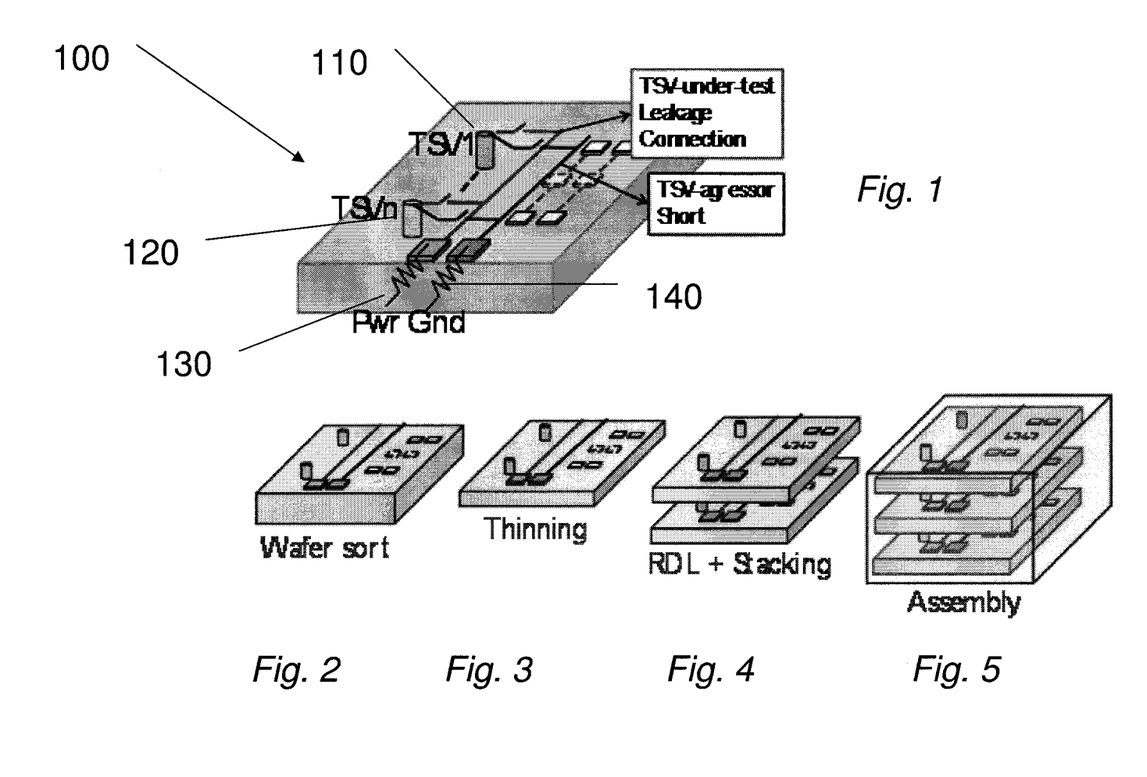
FIG. 1 illustrates a schematic diagram of TSV testing.
FIGS. 2 to 5 illustrate respectively the stages at which TSV testing is carried out in accordance with one embodiment.

In FIG. 1, a wafer 100 is shown that has a plurality of TSV element located thereon arranged in an array, but only TSV elements 110 (TSV1) and 120 (TSVn) are shown for clarity. The wafer also has a power line 130 and a connection to ground 140 as shown. Also shown is a leakage connection for TSV-under-test and a short circuit between TSVs. In the latter case, when testing each TSV for the presence of a short with any other TSV, the relationship of the other TSV to the TSV-under-test is described as TSV-aggressor.

In one embodiment, the testing arrangement is compact as the size of the switches are minimized due to the CMOS technology used and there is no overhead in performance and power in a functional mode. For each wafer, two extra signals are required, one for connection to a clock (re-routed to the JTAG clock, TCK, not shown) and one for connection to a flip-flop (also not shown). The testing operation will be described in more detail below.

FIGS. 2 to 5 illustrate the various stages at which TSV testing can be carried out. Testing for shorts and leakages can be carried out at wafer sort for full thickness wafers (FIG. 2) and after wafer thinning (FIG. 3). Testing after thinning detects wafers that may have been damaged during the thinning process or those which were marginal on the wafer sort and the faults have subsequently been highlighted after the thinning process. Testing after RDL and wafer stacking (FIG. 4) and assembly (FIG. 5) detects, in addition to shorts and leakages, connection issues between each wafer in a stack.

Figure 6:
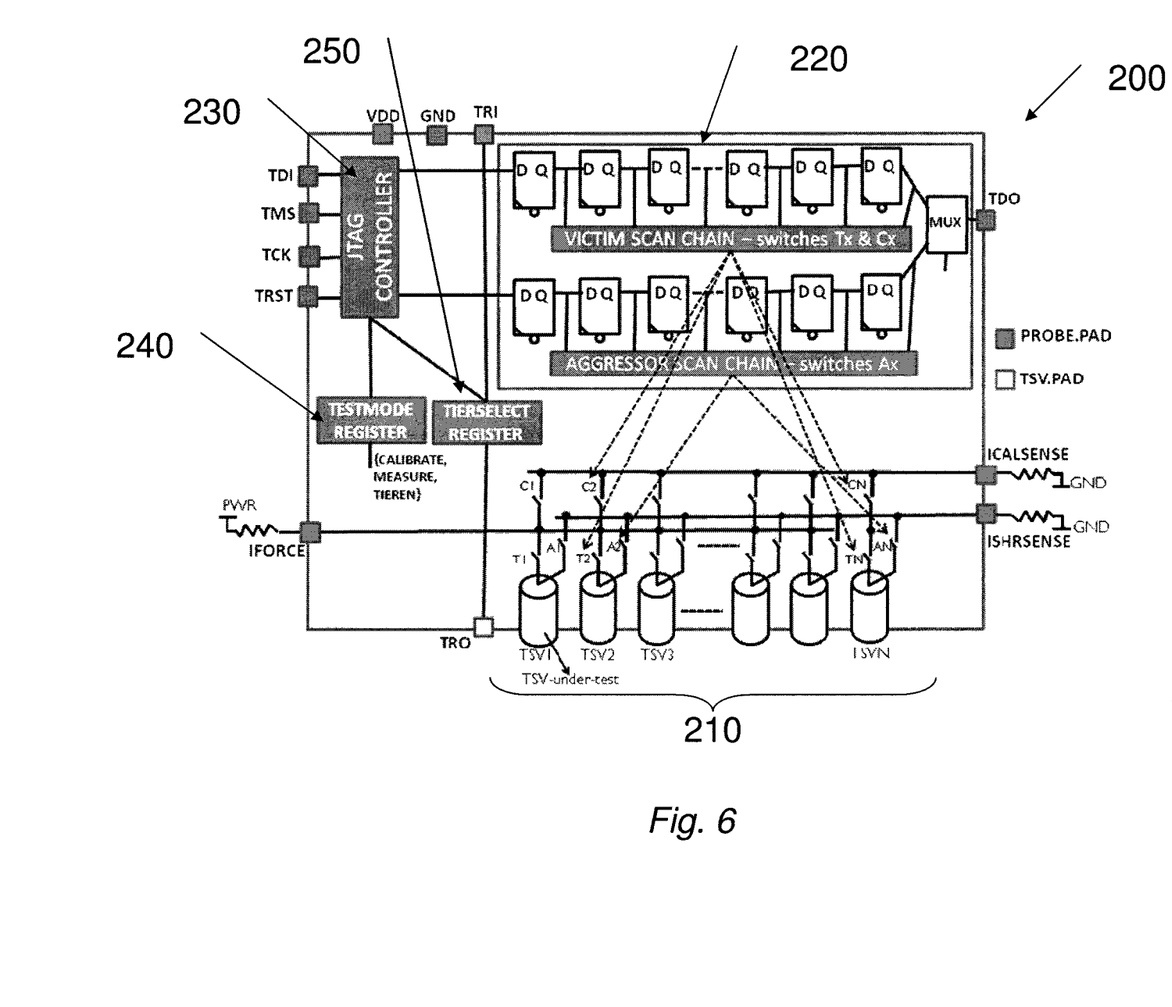
FIG. 6 illustrates design-for-test (DFT) architecture for a single tier in accordance with one embodiment.

In FIG. 6, the DFT architecture 200 is shown for a test network for a single tier or single wafer. The architecture can be programmed by means of any serial programming protocol. In this case, JTAG test protocol is used.

The architecture 200 comprises a plurality of TSVs 210 connected to an IFORCE pin, an ICALSENSE pin, and an ISHRSENSE pin as shown. Each TSV is connected to a victim scan chain and an aggressor scan chain by means of test switches Tx and calibration switches Cx (victim), and aggressor switches Ax (aggressor). As shown, TSV1 is connected by switches T1, C1 and A1, TSV2 is connected by switches T2, C2 and A2, . . . , and TSVN is connected by switches TN, CN and AN. Ideally, the switches Tx, Cx and Ax are matched switches which are enabled/disabled by the operation of a configuration register 220 located in respective victim and aggressor scan chains, the connections between the configuration register 220 and the switches being indicated by dotted lined arrows.

A JTAG controller 230 is provided that is connected to the configuration register 220, a test mode register 240 and a tier select register 250. The controller 230 controls the test process for the TSVs 210. Inputs to the architecture 200 include a test clock pin (TCK), a test mode select input pin (TMS), and a test serial data input pin (TDI). The architecture 200 also includes a test serial data output pin (TDO). In addition, a test asynchronous reset pin (TRST), a power supply node or pin (VDD) and a ground node or pin (GND) are provided. Enable input and output with adjacent tiers are provided by input pin TRI and output pin TRO respectively.

It will be appreciated that although all the pins are shown individually, some of the pins could be shared. For example, the ICALSENSE pin, the ISHRSENSE pin and the GND node or pin could be shared with the ground pin of the chip, the VDD node or pin could be shared with the supply pin of the chip, and the TCK pin, TMS pin, TDI pin, TDO pin and TRST pin could be shared with the existing JTAG pins.

All connections are made with a probe pad (not shown) with the exception of the TRO pin, which is a TSV that handles the tier-to-tier communication.

Figure 7:
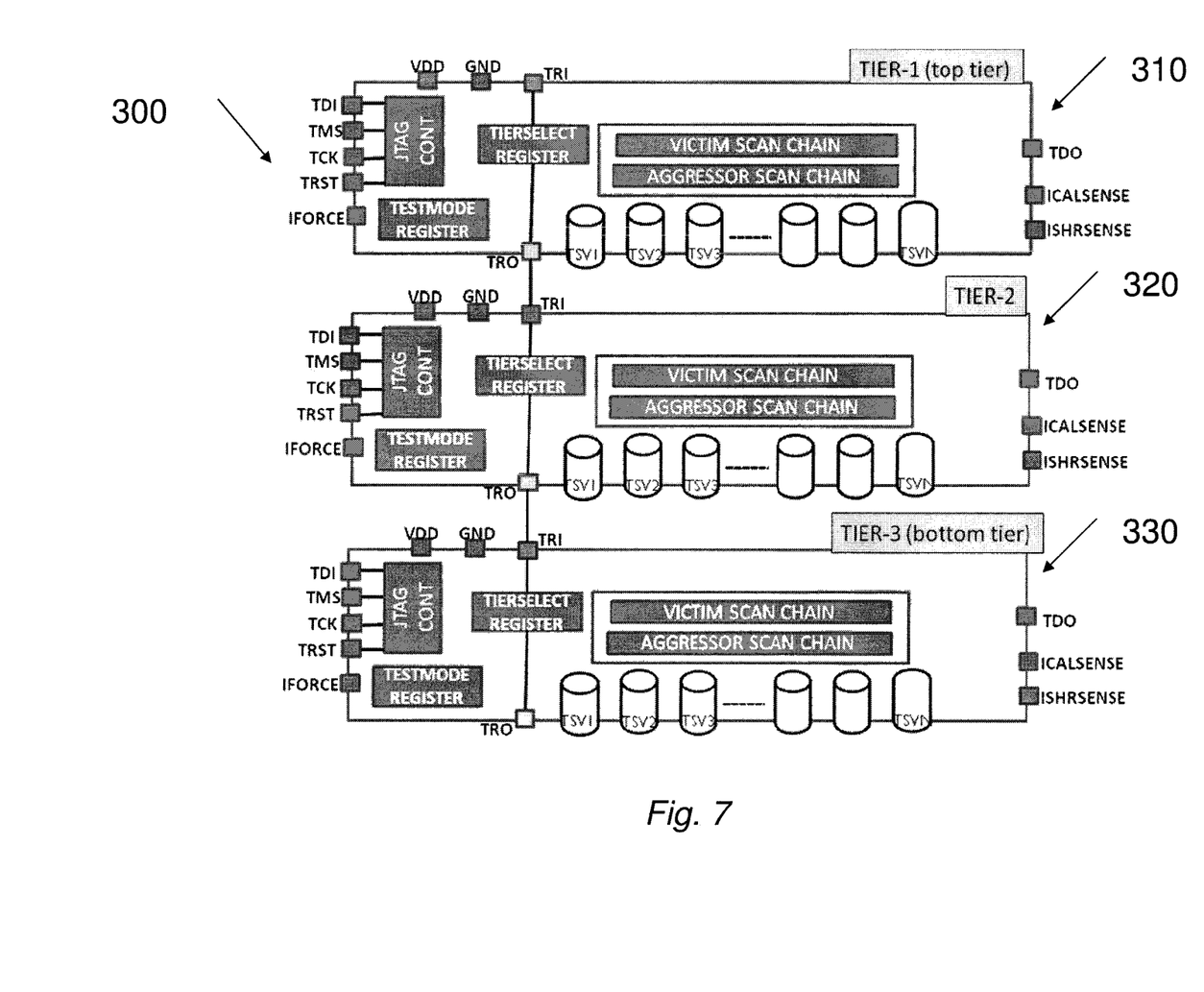
FIG. 7 illustrates DFT architecture for three tiers in a three-dimensional stack in accordance with one embodiment.

FIG. 7 illustrates the architecture 300 for a three-tier testing system. Each tier 310, 320, 330 is identical to the single described with reference to FIG. 6. The tiers 310, 320, 330 are connected for testing by means of the TRO pin from tier 310 connecting with the TRI pin for tier 320, and TRO pin from tier 320 connecting with TRI pin for tier 330. In this case, the tier-under-test is selected by a propagating a logic 'high' through the chained connections of the tier select registers.

Testing is based on monitoring a current coming from an external pull-up resistor towards the three current paths that are controlled by switches that are programmable using a serial programming bus, that is, the IEEE JTAG standard. The three current paths are as follows:
1. TSV-under-test current path (IFORCE)
2. Calibration current path (ICALSENSE)
3. TSV-to-TSV short current path (ISHRSENSE)

The tests are not limited to TSV-related faults but are also applicable to uBump related manufacturing faults.

The following measurements are taken during different stages of the stacking/assembly process: substrate leakage measurements; calibration measurements; and TSV-to-TSV short measurements. Each of these measurements will be described with reference to FIGS. 8 to 10 below respectively.

Figure 8:
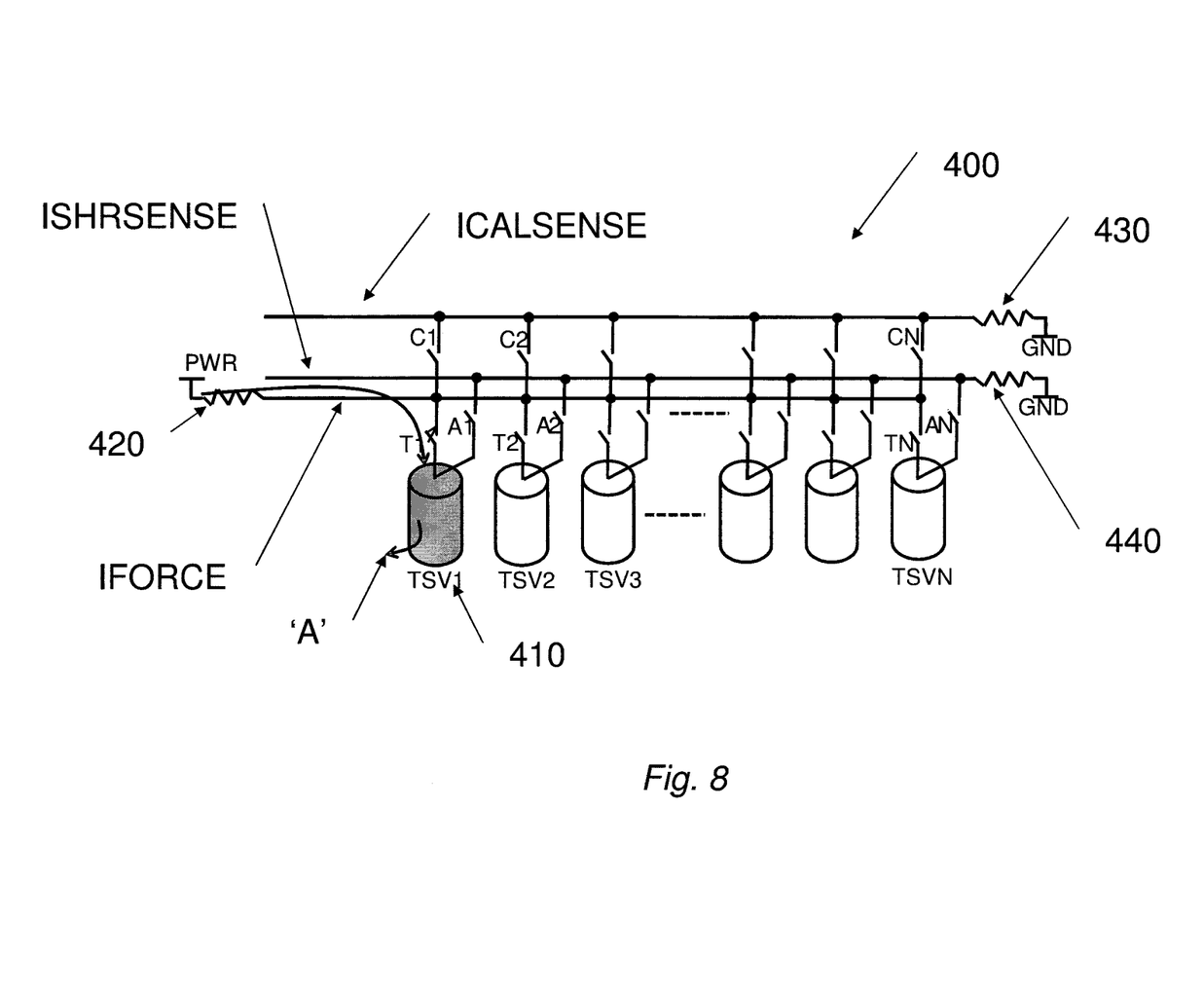
FIG. 8 illustrates a schematic circuit for leakage testing measurements in accordance with one embodiment.

In FIG. 8, a schematic circuit 400 is shown for substrate leakage measurements. The ICALSENSE, ISHRSENSE, and IFORCE lines are shown. As described above, the ICALSENSE and ISHRSENSE lines are connected to ground and the IFORCE line is connected to a power supply. As shown in FIG. 8, TSV1 is the TSV-under-test 410 and the TSV-under-test current path is defined as the path from the power supply, through a pull-up resistor 420, to TSV1 410. The pull-up resistor 420 has a value of a few kOhms (e.g. 2-3 k$\Omega$) and may be formed either as part of the integrated circuit being tested or as part of the test circuit itself. As shown, this current path is connected or enabled by means of the programmable test switch T1 operated by the flip-flops 220 (FIG. 6). If there is any leakage from TSV1 410 to the substrate (not shown) as indicated by arrow 'A', the presence of a leakage current is monitored by measuring the current drawn from the pull-up resistor 420. Further pull-down resistors 430, 440 are also provided for connecting the ICALSENSE and ISHRSENSE lines to ground as shown. Each pull-down resistor 430, 440 has a value of a few kOhms (e.g. 2-3 k$\Omega$).

This test is repeated for each subsequent TSV, TSVN, by closing the associated switch, TN.

Figure 9:
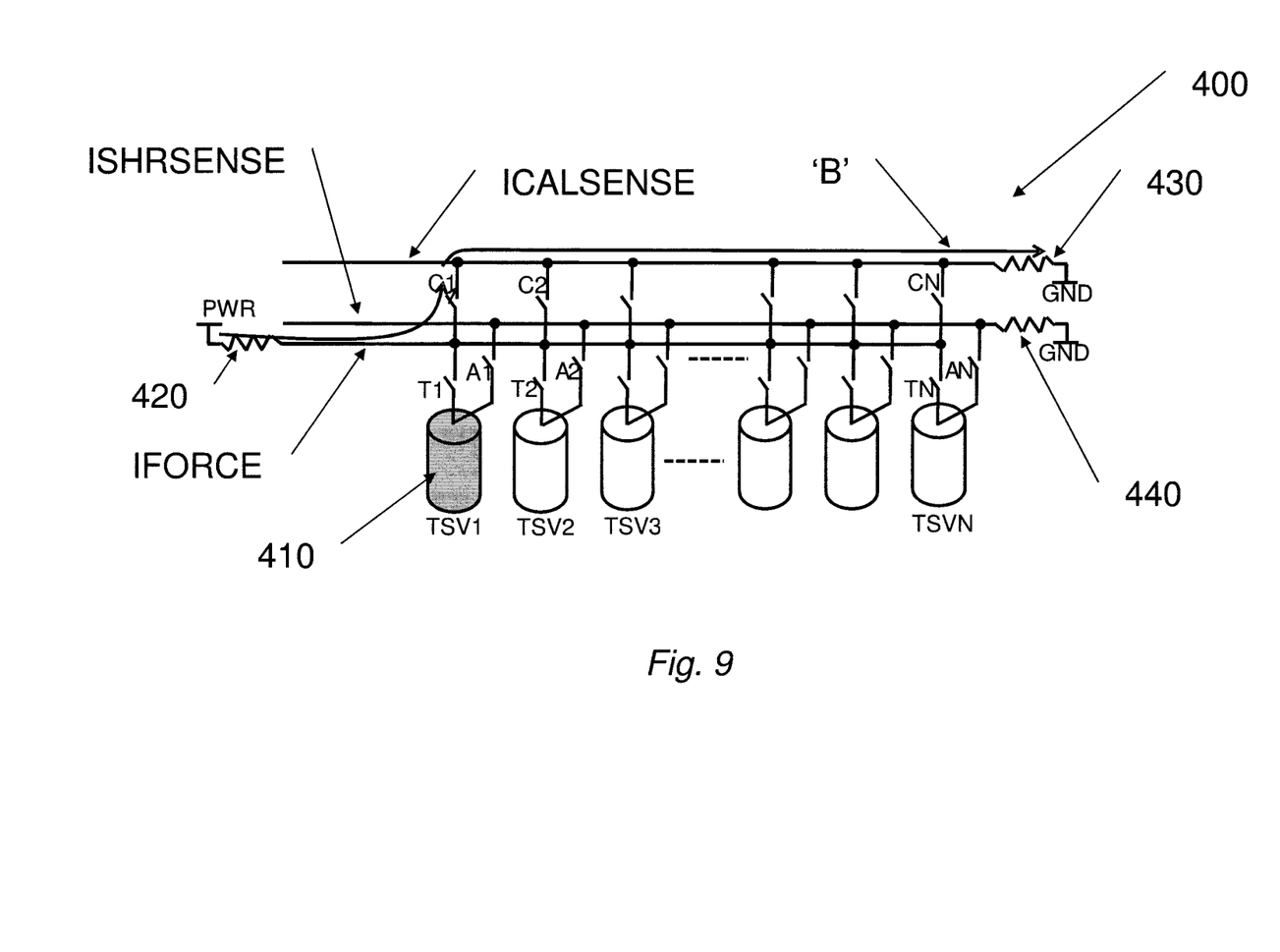
FIG. 9 is similar to FIG. 8 but illustrates resistance calibration measurements in accordance with one embodiment.

For calibration measurements, the same circuit 400 is used but in this case different switches are closed. In FIG. 9, the ICALSENSE line is used for the calibration measurement. TSV1 is again the TSV-under-test as indicated by 410 but in this case, switch C1 is the one that is closed with T1 and A1 being open. The current path is from the power supply, through the pull-up resistor 420, and through switch C1 and along the ICALSENSE line to ground as indicated by arrow 'B'. Here, pull-up resistor 420 provides a calibration current instead of a leakage current.

As before calibration is repeated for each subsequent TSV, TSVN, by closing the associated switch, CN.

Calibration measurements are used to calibrate the resistance of the switches and the bus that are used to connect the TSV-under-test 410. The calibration current measurements (FIG. 9) combined with the leakage current measurements (FIG. 8) allow the resistance of possible leakage paths from each TSV to be determined so that accurate actual leakage current measurements to be calculated.

Figure 10:
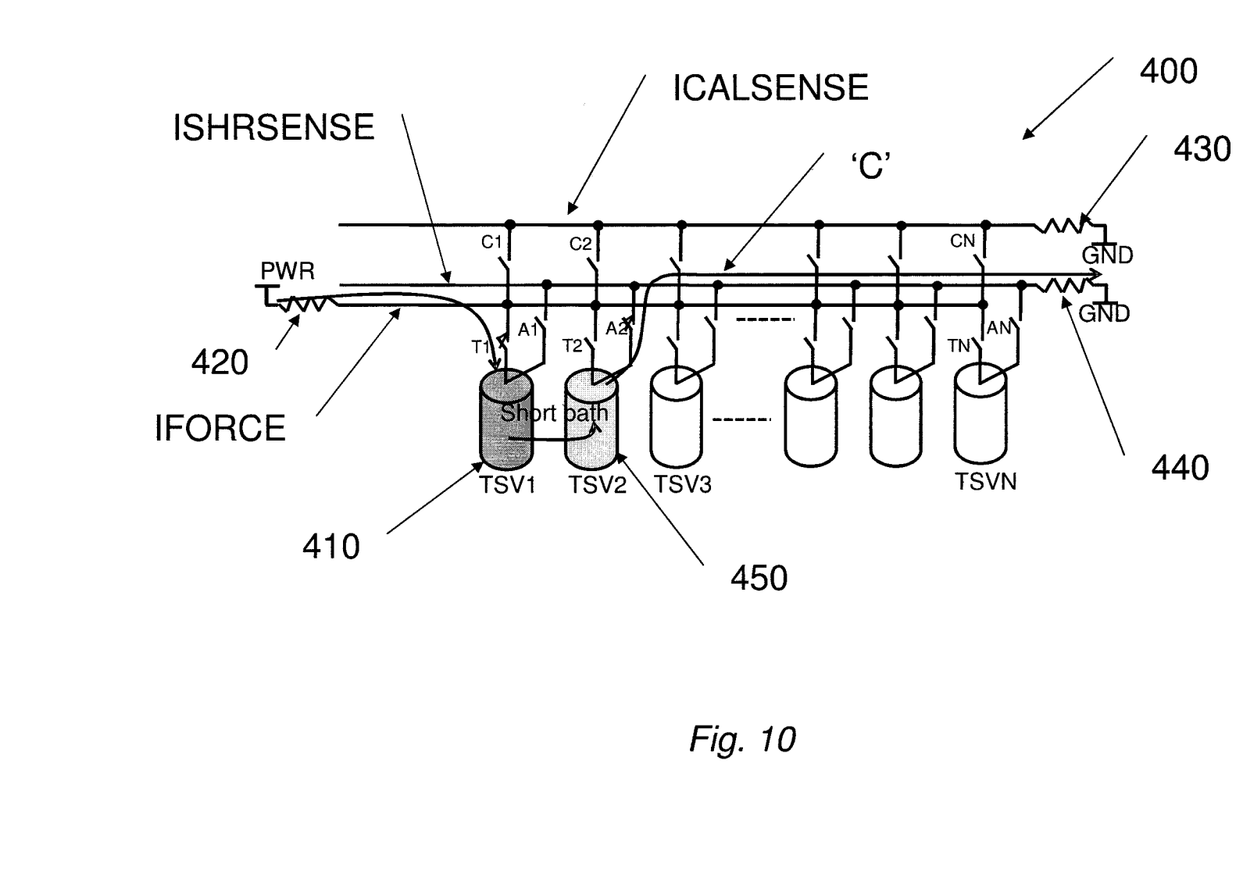
FIG. 10 is similar to FIG. 8 but illustrates TSV-to-TSV short fault measurement in accordance with one embodiment.

In FIG. 10, the same circuit 400 shown in FIGS. 8 and 9 is used to determine TSV-to-TSV short measurements. As shown in FIG. 10, the TSV-under-test 410 is tested for a short with respect to its adjacent TSV, TSV2 450. TSV2 450 is termed the TSV-aggressor. Here, switches T1 and A2 are closed so that, if there is a short between TSV1 410 and TSV2 450, the current path will be from the power supply, through switch T1 to TSV1 410, through TSV2, TSV450 to switch A2 and onto the ISHRSENSE line to ground as shown by arrow 'C'. By closing switch A2, the TSV-aggressor 450 is shorted to ground. The short current is measured in the pull-up resistor 420 instead of a leakage or calibration current as described above with reference to FIGS. 8 and 9 respectively.

Although TSV2 is shown as the TSV-aggressor, it will be appreciated that this process can be repeated for any other TSVN either separately or in combination with other TSVs.

Figure 11:
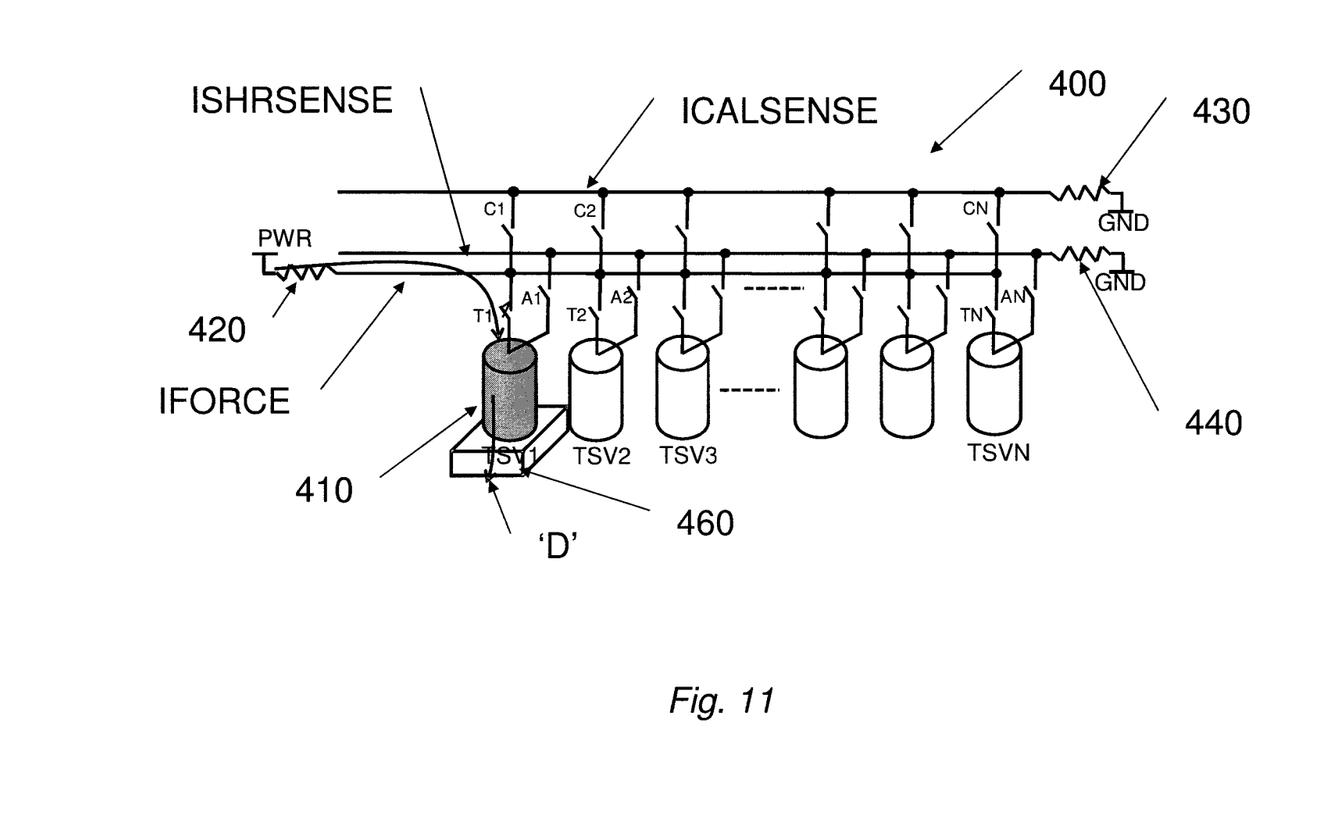
FIG. 11 is similar to FIG. 8 but illustrates tier-to-tier connection fault measurements.

Tier-to-tier connection measurements can also be carried out as shown in FIG. 11. The same circuit 400 is used again for checking the connection quality of TSV-to-metal of bottom tier. As before, switch T1 is closed so that a current flow path is provided from the power supply, through the switch T1 to the TSV 410 and through a metal wire 460 on the bottom tier. The metal wire must be pulled to a known potential, for example, to ground, for the current to flow, as indicated by arrow 'D', so that the measurement can be determined. In this case, the current measured at the pull-up resistor 420 is a connection current and not a leakage current.

Figure 12:
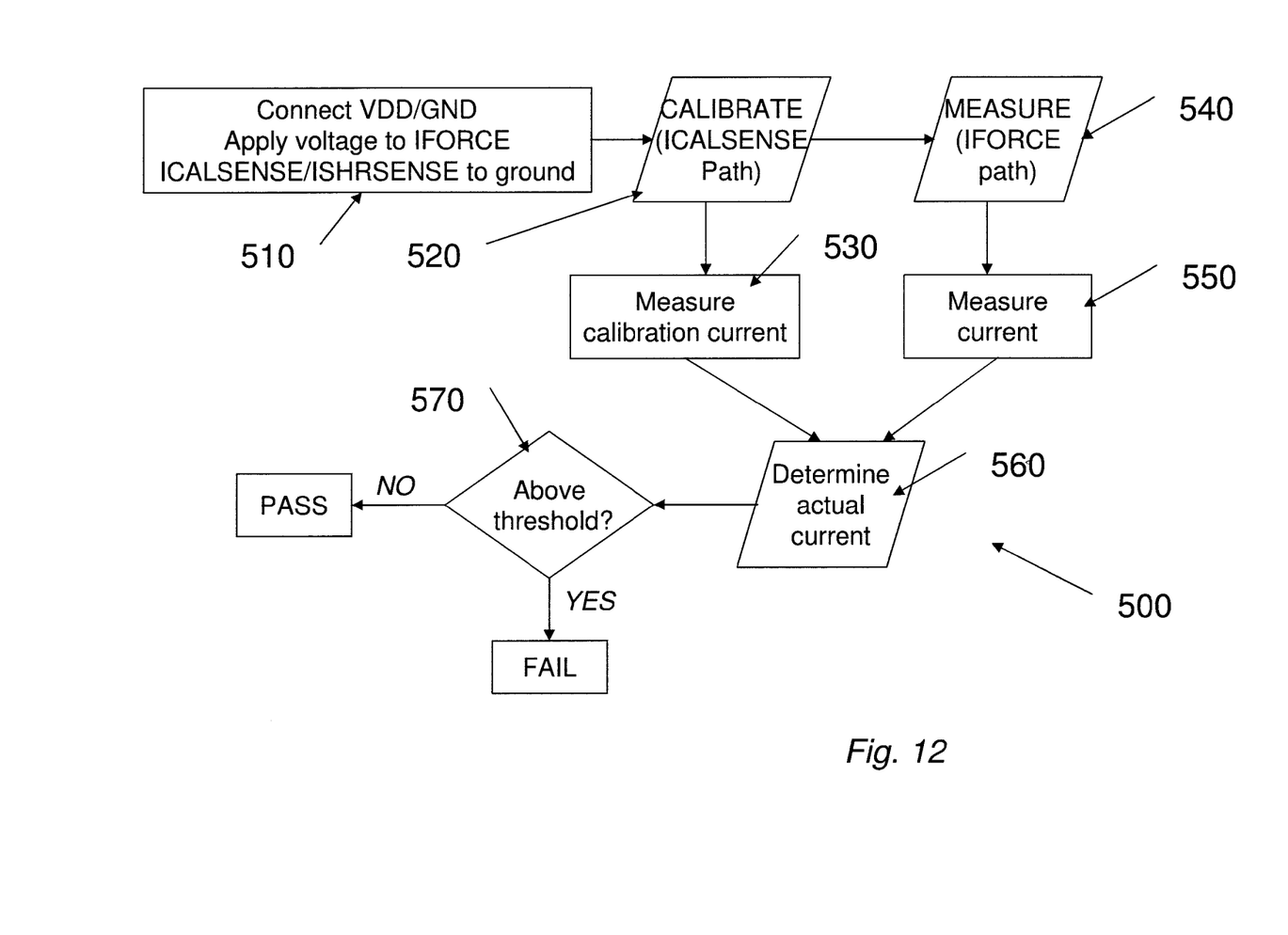
FIG. 12 illustrates a flow chart for fault measurements.

Methods for performing the fault tests will now be described with reference to FIGS. 12 to 14. Here, components which have previously been described in FIGS. 1 to 11 are referenced alike.

The method for measuring leakage during wafer-sort and wafer-thinning, as shown in FIGS. 2 and 3, will now be described with reference to FIG. 12. It will be appreciated that, although the method will be described for TSV1, it is applicable to each and/or a plurality of all TSVN. FIG. 12 illustrates a flow chart 500 in which the first process, process 510, is to connect power/ground connections to VDD/GND, apply a voltage to the IFORCE pin through the pull-up resistor 410, and connect ICALSENSE and ISHRSENSE pins to ground through pull-down resistors 430, 440. The TESTMODE register 240 is programmed to a "CALIBRATE" mode through the JTAG controller 230, and the TSV-under-test is selected through the JTAG controller 230 by shifting in a "logic-high" to the corresponding configuration register 220 (process 520). The calibration current leakage is measured through the ICALSENSE path as the current flowing through the pull-up resistor 420 (process 530). This measurement is then used to calibrate out the resistance of the switch C1 matched to the switch T1 in process 550 below.

Once the resistance values of the switches C1 and T1 have been determined, the TESTMODE register 240 is programmed to a "MEASURE" mode through the JTAG controller 230 (process 540), and the leakage current through the IFORCE path is determined by measuring the current drawn through the pull-up resistor 420 (process 550). In process 560, the leakage current determined in process 550 is then compared with the calibration current leakage determined in process 530 to cancel out the effects of the resistance of switches T1, C1 and A1, and to provide an actual current leakage. The actual current leakage is compared to a threshold in process 570 and if it is above a predetermined value, there is a faulty leakage from TSV 1 to the substrate in which the TSV is mounted and the TSV-under-test is registered as a 'FAIL'. If the actual current is below the threshold, the TSV-under-test is registered as a 'PASS'.

As each TSV-under-test can be individually selected, it is possible to select all TSVs in configuration for measuring the overall leakage in an effort to reduce the test time.

Figure 13:
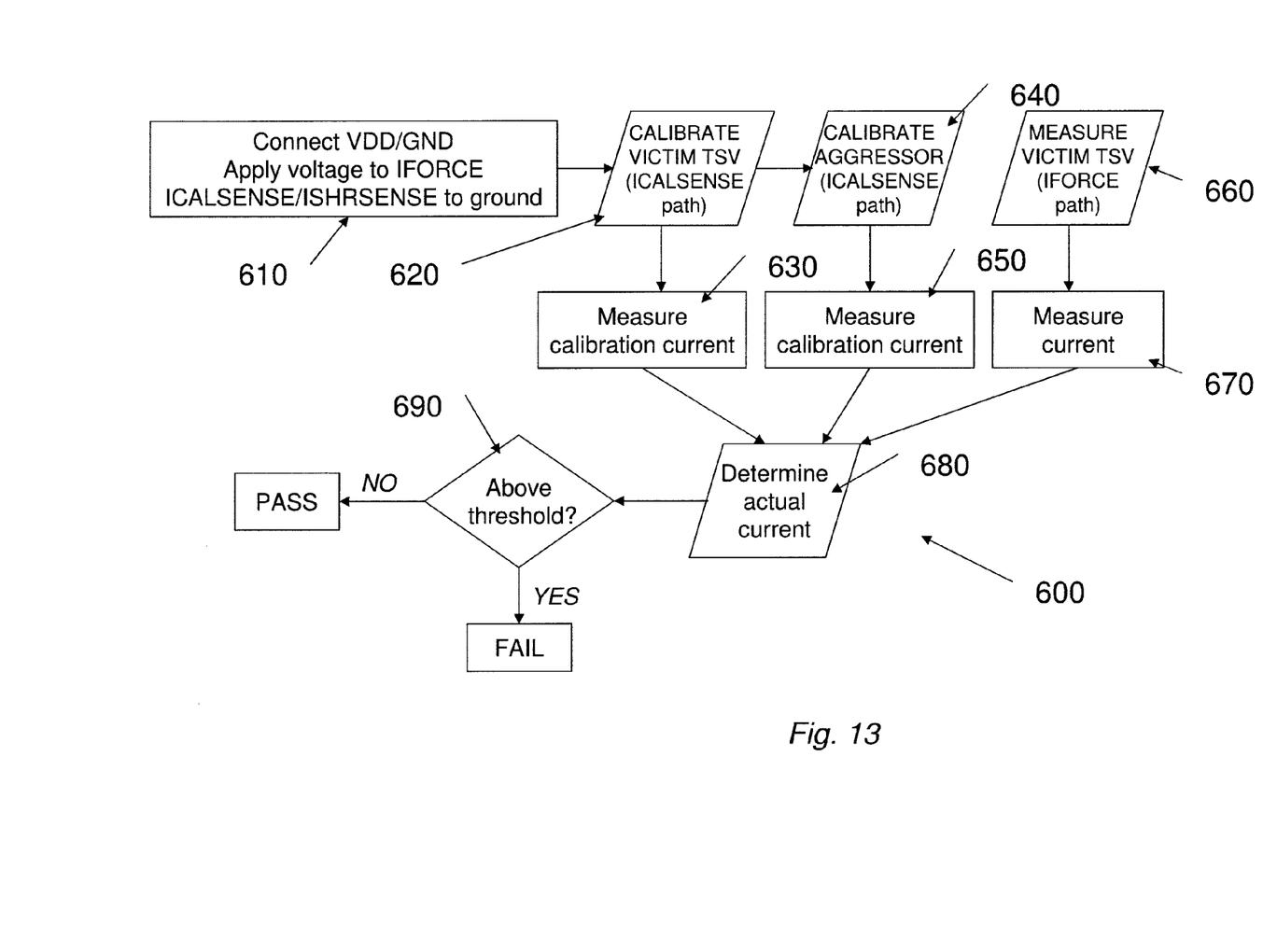
FIG. 13 illustrates a flow chart for short circuit measurements.

In FIG. 13, the method for determining screening faults related to TSV-to-TSV shorts during wafer-sort and wafer-thinning is shown in flow chart 600. In process 610, the power and ground connections are made as described above, voltage is applied to the IFORCE pin through the pull-up resistor 420, the ICALSENSE and ISHRSENSE pins are connected to ground via the pull-down resistors 430, 440 as described above with reference to process 510 in FIG. 12. The TESTMODE register 240 is programmed to the "CALIBRATE" mode through the JTAG controller 230 (process 620). This will then close the C1 switch once the TSV1 is selected as the TSV-under-test. The victim TSV, in this case, TSV1, is selected as the TSV-under-test through the JTAG interface by shifting in a "logic-high" to the corresponding configuration register 220. The leakage through the ICALSENSE path is measured by the pull-up resistor 420 (process 630) and is used to calibrate out the resistance of the switch C1 matched to the switch T1 in process 680 below.

Having selected the victim TSV as TSV1, the aggressor TSV, in this case, is selected as TSV2 (FIG. 10) in process 640. It will be appreciated that any one of the other TSVs could also have been selected as the aggressor TSV. The selection is made by through the JTAG controller 230 by shifting in a "logic-high" to the corresponding configuration register 220. The current leakage through the ICALSENSE path is measured at the pull-up resistor 420 in process 650 and is used to calibrate out the resistance of the switch C2 matched to the switch A2 in process 680 below.

Once the calibration processes have been carried out, the TESTMODE register 240 is then programmed to "MEASURE" mode through the JTAG controller 230 in process 660. This closes switch T1. The aggressor TSV is selected as the TSV-shorting-pin through the JTAG controller 230 by shifting in "logic-high" to the corresponding configuration register 220. In this case, TSV2 is selected as the aggressor as shown in FIG. 10. The leakage current is determined through the IFORCE path by measuring the current drawn through the pull-down resistor 420 in process 670. The leakage current obtained in process 670 is compared the calibration values obtained in processes 630 and 650 above to cancel out the resistance of switches T1 and A2 in process 680. The post-calibration current is compared to a threshold in process 690 and if the post-calibration current is above a predetermined limit, there is a short fault between TSV1 and TSV2 and TSV1 is considered as a 'FAIL'. If the post-calibration current is below the threshold, the TSV-under-test, TSV 1, is considered as a 'PASS'.

It will be appreciated that, although the method above has been described with respect to the TSV-under-test being TSV1 and the aggressor TSV as being TSV2, the method for testing for short faults between TSVs can be carried out for any pair of TSVs in close proximity to one another, for example, TSVx for the victim and TSVy for the aggressor.

Test time for shorts will be reduced by selecting multiple aggressor TSVs in close proximity to the TSV-under-test to create a number of potential shorts therewith.

Figure 14:
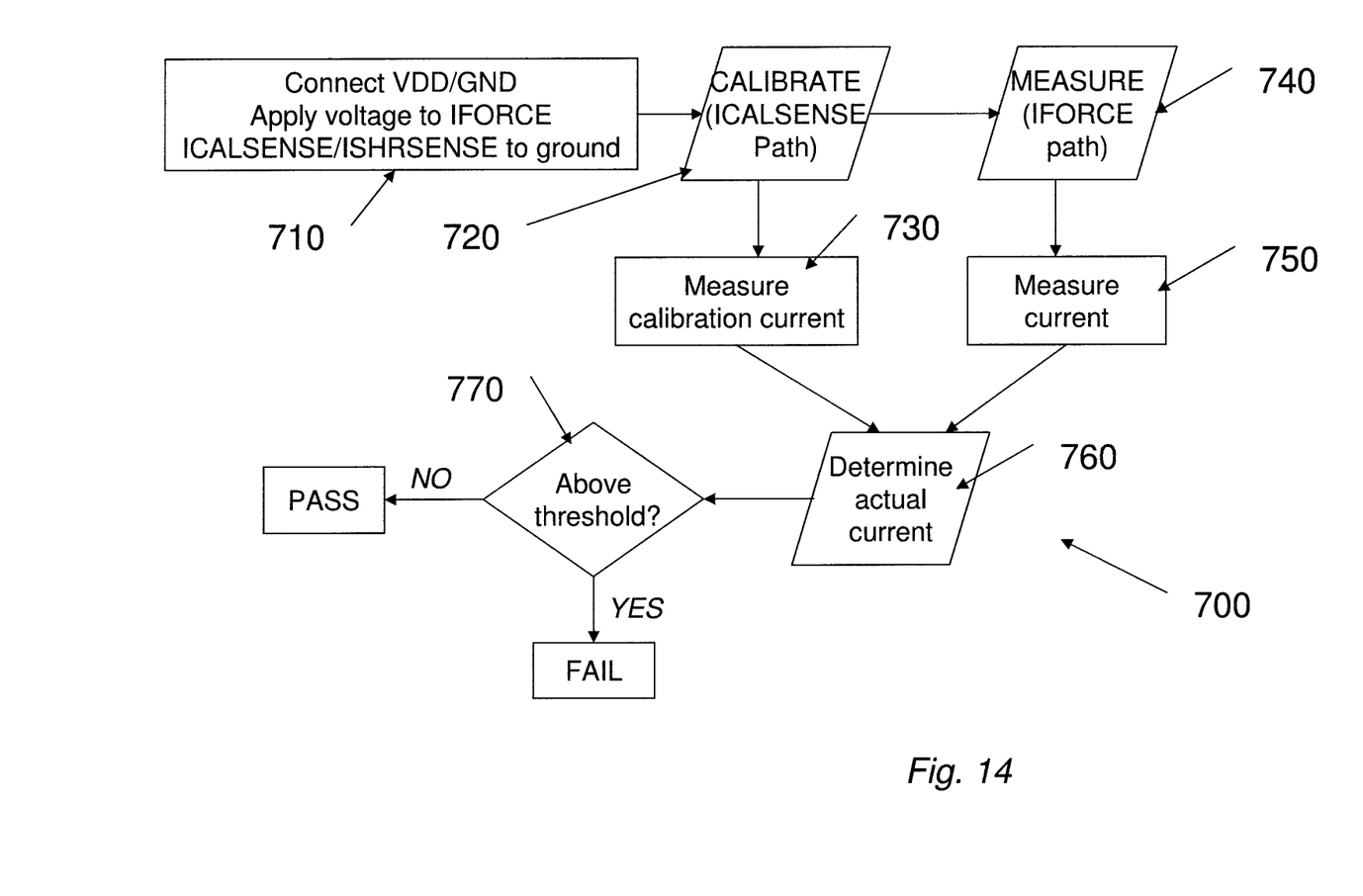
FIG. 14 illustrates a flow chart for connection measurements between tiers.

A flow chart 700 for measuring tier-to-tier connection faults after stacking, as described above with reference to FIGS. 4 and 5, is shown in FIG. 14. In process 710, connections to VDD/GND are made, a voltage supply is connected to the IFORCE pin through the pull-up resistor 420, and the ICALSENSE and ISHRSENSE pins are connected to ground by means of the pull-down resistors 430, 440. A "logic-high" signal is supplied to the tier being tested via the TIERSELECT register chain 250 starting with the uppermost tier. The last tier is the one on top of the lowermost tier. All TSVs located below the selected tier is pulled-down to ground. In process 720, the TESTMODE register 240 is programmed to the "CALIBRATE" mode through the JTAG controller 230, and the TSV-under-test is selected through the JTAG controller 230 by shifting in "logic-high" to the corresponding configuration register 220. The leakage current through the ICALSENSE path is measured in process 730. This measurement will then be used calibrate out the resistance of the switch C1 matched to the switch T1 in process 790 below.

In process 740, the TESTMODE register 240 is programmed to the "MEASURE" mode through the JTAG controller 230, and the leakage current is measured through the IFORCE path by measuring the current drawn through the pull-up resistor 420 in process 750. In process 760, the current determined in process 730 is compared with the current determined in process 750 to calibrate out the resistance of switches and to provide an actual current value. The actual current value is compared to a threshold in process 760, and if above a predetermined value, there is a faulty connection from TSV1 to the bottom tier and the TSV1 is considered as a 'FAIL'. If the actual current is below the threshold, the TSV-under-test is considered as a 'PASS'. The processes are repeated for the next tier.

In a similar way, fault modes of long tracks between digital and analogue can be tested using the same set of circuits described above. This is done by measuring a potential leakage of the track itself if the track is terminated with a high-impedance (which is typical in case where the driver of a CMOS gate or the supply of driver on the analogue side is not connected) and by measuring a potential short with a neighboring track which is also between digital to analogue.

The overhead of fault monitoring circuits is assessed in terms of silicon area overhead, interconnect overhead, and test time analysis and its optimization using parallel measurements.

Silicon (active) area overhead of the unit circuit per TSV comprises: three NMOS switches that control the connection to the ICALSENSE, ISHRSENSE and the IFORCE current paths; combinational logic in the form of two AND gates, a NOR gate, an OR gate, two flip-flops and a multiplexor. The two flip-flops are provided for the two boundary-scans to select the TSV-under-test and the TSV-aggressor, and share the task of enabling the industry standard boundary scan tests across TSVs. The multiplexor is used to multiplex the output of the two boundary scans to the common serial output TDO.

The interconnect overhead for a chip that contains N TSVs comprises:
a) a configuration clock that is common for all of N TSVs—this is used for the boundary scan that selects the TSV-under-test;
b) a configuration clock that is common for all of N TSVs—this is used for the boundary scan that selects the TSV-aggressor.
c) a calibration enable that is common for all of N TSVs—this is used for calibrating the switch resistance for the TSV-under-test before it is selected;
d) a measurement enable that is common for all of N TSVs—this is used for calibrating the switch resistances of the TSV-under-test before it is selected;
e) a single serial scan data input;
f) a single asynchronous active-low reset that resets the configuration in the boundary scan registers;
g) a single asynchronous active-low reset that resets the parasitic capacitances as well as being used as a short enable switch for the aggressor TSV; and
h) N sense lines where each is connected to each of N TSVs.

The actual pin overhead is substantially lower. Most of signals above could be generated by means of an on-chip test controller accessed by the industry-standard JTAG protocol. Pins required for the JTAG protocol (TDI, TDO, TCLK, TMS, TRST) could well be utilized (FIG. 6). The remaining pin overhead will then be limited to the current path pins: ICALSENSE, ISHRSENSE and IFORCE.

The active area and wiring overhead of test circuits are also negligible. As the circuit operates in current mode, the location of the unit cells in the chip can be selected and grouped together to provide a compact layout. It is also possible to integrate the complete group of cells in the digital part of the circuit in order to have a compact routing of control/clock signals in the circuit.

Integrating the TSV test circuits in the digital part, will not jeopardize the industry-standard IDDQ tests (current testing in the quiescent state for CMOS technology). The IDDQ test will be done by keeping the calibration enable, c) above, high and the measurement enable, d) above, low. This ensures no conducting current during IDDQ.

Ideal testing is done by testing leakage of each TSV one by one, by testing short of each TSV to each of TSVs that could act as aggressor, and by measuring the connection of each TSV to the tier below. The worst-case test time for an M-tier system where each tier consists of N TSVs will include or consist of the following:
1) Wafer sort and/or wafer thinning:
    1: M×N leakage measurements
    2: N×(N−1)*M short measurements
2) Stacking and/or final device:
    1: M×N leakage measurements
    2: N×(N−1)*(M−1) short measurements
    3: N*(M−1) connection measurements where each device is tested negative in process 2

Test time will be significantly reduced by selecting TSVs in parallel to measure the overall leakage of all TSVs. Test time for shorts will be reduced by selecting aggressor TSVs in groups that create a potential short with the TSV-under-test and that are in close proximity to the TSV-under-test. It is also possible to select TSVs in parallel to measure the connection between the tier under test and the bottom tier once any potential short fault within that group is screened negative from the previous short test. Following this optimization, the overall test time in an M-tier where each tier consists of N TSVs for different stages of testing will include or consist of following processes:
1) Wafer sort and/or wafer thinning:
    1: M leakage measurements
    2: N×M short measurements
2) Stacking and/or final device:
    1: M leakage measurements
    2: N×M short measurements
    3: (M−1) connection measurements where each device is tested negative in process 2

As an example, for a system with 4 tiers where each tier employs 100 TSVs, the parallel leakage test time for 100 TSVs will be 1 ms per tier, and the typical test time for each of the short and connection measurements will be 10 μs per TSV. Therefore, for each of wafer-sort and wafer-thinning testing phases, the test time will be 8 ms (4 ms for leakage +4 ms for short). For each of the stacking and final device testing phases, the test time will be 8.01 ms (4 ms for leakage +4 ms short +0.01 ms for connection). The overall test time for all phases of test will be 32.01 ms, which is considerably short compared to the typical test time of complex chips, for example, between 5s and 10s test time for each of wafer-sort and final test for a chip having more than 100,000 gates with 400 input/outputs).

It will be appreciated that the present disclosure is not limited to testing TSVs and/or ubumps and can be used to test other components in an IC.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of performing at least one fault mode test on at least one of a plurality of through-silicon-vias arranged on a substrate in an integrated circuit, the method comprising:
   a) selecting, by a controller, a through-silicon-via to be tested from the plurality of through-silicon-vias;
   b) selecting, by the controller, a calibration mode ("CALIBRATE") for the selected through-silicon-via, wherein the calibration mode comprises:
      c) determining, by a test circuit, a calibration current measurement for the selected through-silicon-via by measuring current through a calibration current path, the calibration current path matched to the resistance of at least one switch in a path connecting the selected through-silicon-via to a measurement current path, the calibration current measurement configured to calibrate out the resistance of the switch to the selected through-silicon-via;
   d) selecting, by the controller, a measurement mode ("MEASURE") for the selected through-silicon-via, wherein the measurement mode comprises:
      e) determining, by the test circuit, a measurement current for the selected through-silicon-via by measuring current through the measurement current path, the measurement current path comprising the switch to the selected through-silicon-via and the selected through-silicon-via;
   f) determining, by the test circuit, an actual measurement current using the determined calibration current measurement and the determined measurement current; and
   g) comparing, by the test circuit, the actual measurement current to a threshold in accordance with a screening condition for the selected through-silicon-via.

2. The method according to claim 1, wherein the process b) comprises closing at least one switch in the selected calibration current path.

3. The method according to claim 1, wherein the process d) comprises closing the at least one switch in a path connecting the selected through-silicon-via to the measurement current path.

4. The method according to claim 1, wherein the at least one fault mode test comprises a leakage test between the selected through-silicon-via and the substrate.

5. The method according to claim 1, wherein the at least one fault mode test comprises a short test between the selected through-silicon-via and at least one other through-silicon-via in close proximity to the selected through-silicon-via.

6. The method according to claim 5, wherein the processes b) and c) are repeated for the at least one other through-silicon-via, and the process f) comprises using the calibration measurements for the selected through-silicon-via and the at least one other through-silicon-via to increase the actual measurement accuracy.

7. The method according to claim 1, wherein the at least one fault mode test comprises a connection test between the selected through-silicon-via and another tier of the integrated circuit.

8. The method according to claim 1, wherein the through-silicon-via formed on at least one tier of the integrated circuit.

9. The method according to claim 8, wherein the at least one tier comprises a plurality of through-silicon-vias.

10. A test system for performing at least one fault mode test on at least one through-silicon-via arranged on a substrate in an integrated circuit, the system comprising:
    a power supply;
    a controller configured to select a through-silicon-via to be tested, the controller further configured to select a calibration mode ("CALIBRATE") for the selected through-silicon-via, the controller further configured to select a measurement mode ("MEASURE") for the selected through-silicon-via; and
    a test circuit configured to determine a calibration current measurement for the selected through-silicon-via by measuring current through a calibration current path, the calibration current path matched to the resistance of at least one switch in a path connecting the selected through-silicon-via to a measurement current path, the calibration current measurement configured to calibrate out the resistance of the switch to the selected through-silicon-via,
    the test circuit further configured to determine the measurement current for the selected through-silicon-via by measuring current through the measurement current path, the measurement current path comprising the switch to the selected through-silicon-via and the selected through-silicon-via,
    the test circuit further configured to determine an actual measurement current using the determined calibration current measurement and the determined measurement current, and
    the test circuit further configured to compare the actual measurement current to a threshold in accordance with a screening condition for the selected through-silicon-via, the test circuit comprising:
      a calibration path, comprising an ICALSENSE line, connected to ground and connectable to the power supply by means of a calibration switch;
      a short path, comprising an ISHRSENSE line, connected to ground and connectable to the at least one through-silicon-via by means of an aggressor switch; and a measurement path, comprising an IFORCE line, connected to the power supply and connectable to the at least one through-silicon-via by means of a test switch, and wherein the controller is further configured to close at least one of the calibration switch, the aggressor switch, and the test switch in accordance with the at least one fault mode test.

11. The test system according to claim 10, wherein the test circuit further comprises pull-up resistor connected to the measurement path and configured to provide current measurements in accordance with the at least one fault mode test.

12. The test system according to claim 11, wherein the pull-up resistor is located on the integrated circuit.

13. The test system according to claim 11, wherein the pull-up resistor is part of the test circuit.

14. The test system according to claim 10, wherein the test circuit further comprises a first pull-down resistor and a ssecond pull-down resistor connected between respective pull-down resistors of the calibration path and the short path and ground.

15. The test system according to claim 10, wherein the through-silicon-via is formed on at least one tier of the integrated circuit.

16. The test system according to claim 15, wherein the at least one tier comprises a plurality of through-silicon-vias.

17. The test system according to claim 15, wherein the integrated circuit comprises a plurality of tiers.

18. The test system according to claim 10, wherein the through-silicon-via is located on a substrate and wherein the at least one fault mode test comprises a leakage test between the through-silicon-via and the substrate.

19. The test system according to claim 10, wherein the at least one fault mode test comprises a connection test between the selected through-silicon-via and another tier of the integrated circuit.

* * * * *